US010848132B2

(12) United States Patent
Shi

(10) Patent No.: US 10,848,132 B2
(45) Date of Patent: Nov. 24, 2020

(54) APPARATUS AND METHOD FOR CONTROLLING A TRANSITION OF A VARIABLE CAPACITOR

(71) Applicant: Futurewei Technologies, Inc., Plano, TX (US)

(72) Inventor: Ping Shi, San Diego, CA (US)

(73) Assignee: Futurewei Technologies, Inc., Plano, TX (US)

(*) Notice: Subject to any disclaimer, the term of this patent is extended or adjusted under 35 U.S.C. 154(b) by 810 days.

(21) Appl. No.: 15/589,694

(22) Filed: May 8, 2017

(65) Prior Publication Data
US 2018/0323772 A1 Nov. 8, 2018

(51) Int. Cl.
*H01G 4/255* (2006.01)
*H03J 3/20* (2006.01)
*H01G 7/00* (2006.01)
*H01G 5/38* (2006.01)
*H01G 4/38* (2006.01)
*H01G 4/40* (2006.01)

(52) U.S. Cl.
CPC .............. *H03J 3/20* (2013.01); *H01G 4/255* (2013.01); *H01G 4/38* (2013.01); *H01G 4/40* (2013.01); *H01G 5/38* (2013.01); *H01G 7/00* (2013.01); *H03J 2200/10* (2013.01)

(58) Field of Classification Search
CPC .. H03M 1/00; H03H 11/1291; H03J 2200/10; H03J 3/20; H03K 17/223; H01G 4/255; H01G 4/38; H01G 4/40; H01G 5/38; H01G 7/00
See application file for complete search history.

(56) References Cited

U.S. PATENT DOCUMENTS 7,064,591 B1* 6/2006 Humphreys .............. H03L 7/10
327/156
2010/0283551 A1* 11/2010 Zeng ..................... H03B 5/1253
331/117 FE
2013/0191695 A1* 7/2013 Douskey ................. G06F 11/27
714/733

OTHER PUBLICATIONS

Semiconductor Components Industries, "TCC-202: Two-Output PTIC Control IC," Sep. 2016, pp. 1-23.

* cited by examiner

*Primary Examiner* — Sibin Chen
(74) *Attorney, Agent, or Firm* — Fish & Richardson P.C.

(57) ABSTRACT

An apparatus and associated method are provided involving one or more registers configured to store a plurality of values including a first value corresponding with a first capacitance, and a second value corresponding with a second capacitance. Further included is a decoder configured to decode the values into corresponding capacitive settings. Also included is one or more capacitive elements in electrical communication with the decoder. Such one or more capacitive elements are configured to exhibit different capacitances, based on the capacitive settings. Also included is control circuitry in electrical communication with the decoder and the one or more registers. Such control circuitry is configured to control a transition of the capacitance of the one or more capacitive elements from the first capacitance to the second capacitance, by creating a plurality of additional values between the first value and the second value for being decoded by the decoder.

20 Claims, 8 Drawing Sheets

APPARATUS AND METHOD FOR CONTROLLING A TRANSITION OF A VARIABLE CAPACITOR

FIELD OF THE INVENTION

The present invention relates to capacitor element(s), and more particularly to variable capacitor element(s).

BACKGROUND

Digitally-tuned tunable capacitors are typically controlled by digital logic, and usually comprise switches to add or reduce component capacitors in an associated bank. Since an available capacitance is discrete, a change from one state to another involves a state change (e.g. from a first capacitance to a second capacitance). In certain applications, such a sudden change in capacitance value may create undesired effects. For example, in the case of a voltage controlled oscillator (VCO), such sudden change may result in an overshoot and spur (in voltage) in a frequency domain. As another example involving closed loop impedance tuning, a large change of a tuning capacitor may create large impedance changes, thus causing amplitude and phase discontinuity in signals and interrupting the decoding of a downlink and/or uplink signal.

SUMMARY

An apparatus is provided including one or more registers configured to store a plurality of values including a first value corresponding with a first capacitance, and a second value corresponding with a second capacitance. Further included is a decoder configured to decode the values into corresponding capacitive settings. Also included is one or more capacitive elements in electrical communication with the decoder. Such one or more capacitive elements are configured to exhibit different capacitances, based on the capacitive settings. Also included is control circuitry in electrical communication with the decoder and the one or more registers. Such control circuitry is configured to control a transition of the capacitance of the one or more capacitive elements from the first capacitance to the second capacitance, by creating a plurality of additional values between the first value and the second value for being decoded by the decoder.

Also provided is a method that involves storing, utilizing one or more registers, a plurality of values including a first value corresponding with a first capacitance, and a second value corresponding with a second capacitance. A plurality of additional values are created between the first value and the second value. The method continues by decoding, utilizing a decoder, the values and the additional values into corresponding capacitive settings. To this end, a capacitance of one or more capacitive elements is adjusted, based on the capacitive settings, so that a transition of the capacitance of the one or more capacitive elements is controlled from the first capacitance to the second capacitance.

Optionally, in any of the preceding embodiments, the control circuitry may include a counter for creating the additional values between the first value and the second value.

Optionally, in any of the preceding embodiments, a number of the additional values may be fixed. As an option, the control circuitry may be configured to calculate a difference between the additional values by dividing a difference between the first value and the second value, by the fixed number. As a further option, the control circuitry may be configured to calculate the difference between the additional values by rounding a result of the division down to a nearest integer.

Optionally, in any of the preceding embodiments, a difference between the additional values may be fixed. As an option, the control circuitry may be configured to calculate a number of the additional values by dividing a difference between the first value and the second value, by the fixed difference.

Optionally, in any of the preceding embodiments, the control circuitry may be configured to calculate the additional values based on a maximum length of time permitted for the transition of the capacitance of the one or more capacitive elements, and a maximum difference permitted between the additional values.

Optionally, in any of the preceding embodiments, the one or more capacitive elements may include a plurality of fixed capacitive elements, with one or more switches for selectively using the fixed capacitive elements.

Optionally, in any of the preceding embodiments, the one or more capacitive elements may include one or more variable capacitive elements, with one or more controllers for controlling the capacitance of the one or more variable capacitive elements.

One or more of the features of the foregoing apparatus and/or method may permit a more gradual or granular transition between previous and desired capacitances. This may, in turn, result in fewer detrimental side effects that would otherwise be foregone in systems that simply transition directly from the previous capacitance to the desired capacitance, in a single step. For example, in the case of a voltage controlled oscillator (VCO), any sudden change in capacitance may be avoided which, in turn, may help avoid any overshoot and spur (in voltage) in a frequency domain. Further, in the case of closed loop impedance tuning, a large change of a tuning capacitor may be avoided which, in turn, may help avoid any amplitude and phase discontinuity, for providing improved decoding of a downlink and/or uplink signal. It should be noted that the aforementioned potential advantages are set forth for illustrative purposes only and should not be construed as limiting in any manner.

DETAILED DESCRIPTION

Figure 1:
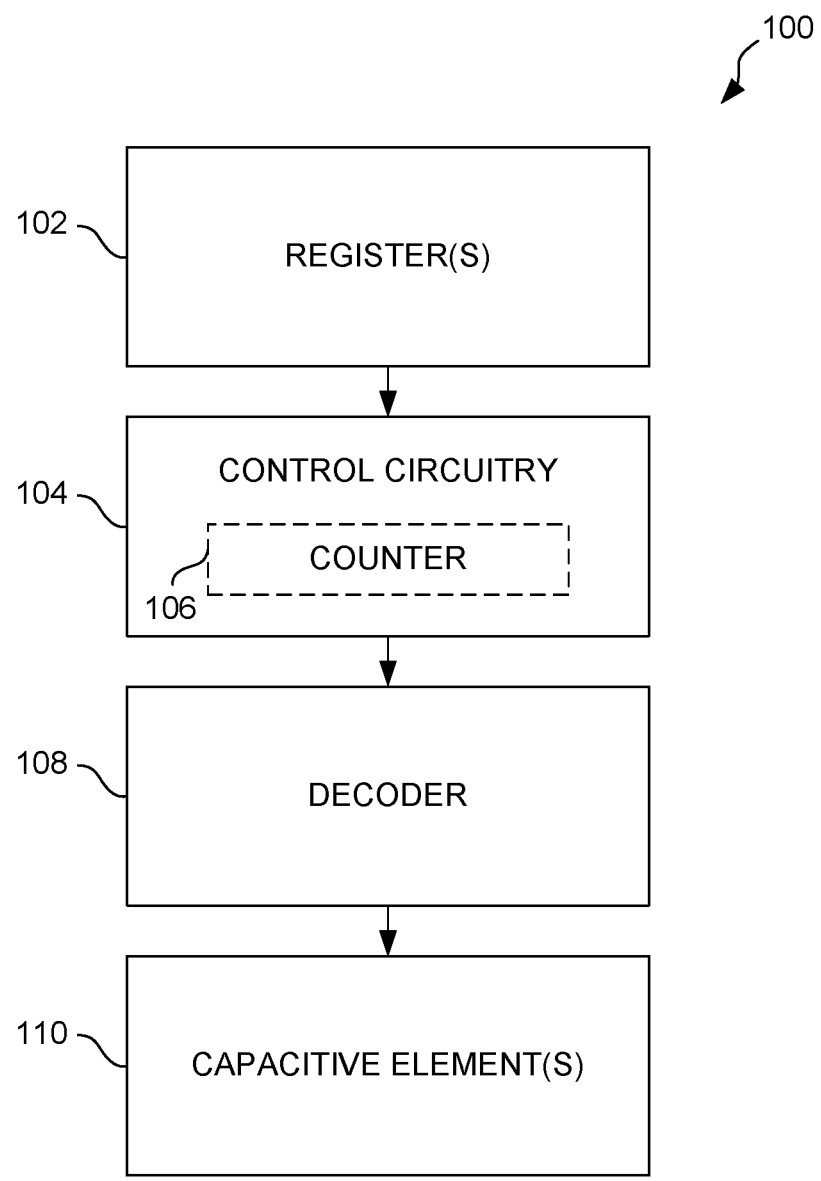
FIG. 1 illustrates an apparatus for controlling a transition of a capacitance of one or more capacitive elements from a first capacitance to a second capacitance, in accordance with an embodiment.

FIG. 1 illustrates an apparatus 100 for controlling a transition of a capacitance of one or more capacitive elements from a first capacitance to a second capacitance, in accordance with an embodiment. As shown, the apparatus 100 includes one or more registers 102 in electrical communication with control circuitry 104 (including a counter 106 and/or other circuitry). The control circuitry 104 is, in turn, in electrical communication with a decoder 108 that is in electrical communication with one or more capacitive elements 110. In the context of the present description, the aforementioned "electrical communication" may refer to any direct coupling, or indirect coupling where the foregoing components are coupled via one or more other unillustrated components. Further, while the foregoing components are shown to be discrete in FIG. 1, it should be noted that other embodiments are contemplated where one or more of such components are integrated, as desired. More information will now be set forth regarding each of the foregoing components and an interoperation thereof.

In the context of the present description, the register(s) 102 may refer to any memory or storage configured to store a plurality of values (e.g. binary, alphanumeric, coded, etc.) corresponding with different capacitances. In one embodiment, such values may include a first value corresponding with a first capacitance (e.g. a previous capacitance), and a second value corresponding with a second capacitance (e.g. a new desired capacitance). In various embodiments, the first and second values may be stored in the same register, or separate registers. As will become apparent, the aforementioned first and second values may be used to transition a capacitance of the apparatus 100 between the previous capacitance and the desired capacitance.

Also in the present description, the decoder 108 may refer to any electronic device that converts signals from one form to another. In one embodiment, the decoder 108 is configured to decode the values (e.g. the binary, alphanumeric and/or coded values corresponding to the aforementioned capacitances, etc.) into corresponding capacitive settings that may be used to control the capacitive element(s) 110. In various embodiments, such capacitive settings may take on any format that is a function of a type of the capacitive element(s) 110. For example, in various embodiments, such capacitive settings may include signals for controlling switches, signals for controlling mechanical/electrical components, etc. that control the capacitive element(s) 110 in a manner that will soon be set forth.

Further, the capacitive element(s) 110 may include any digitally-controlled capacitor or component that exhibits a capacitance. To this end, the capacitive element(s) 110 are configured to exhibit different capacitances, based on the capacitive settings of the decoder 108. In one embodiment, the capacitive element(s) 110 may include a plurality of fixed capacitive elements, such that the apparatus 100 further comprises one or more switches (not shown) for selectively using the fixed capacitive elements to exhibit the different capacitances. In such embodiment, each fixed capacitive element may optionally include an associated switch for selectively including the fixed capacitive element in an array of fixed capacitive elements, in order to adjust the overall capacitance based on a capacitance that the fixed capacitive element contributes to the overall array.

In other embodiments, the capacitive element(s) 110 may include one or more variable capacitive elements, such that the apparatus 100 further comprises one or more controllers (not shown) for controlling the capacitance of the one or more variable capacitive elements. In various embodiments, the capacitive element(s) 110 may be implemented using any desired technology including, but not limited to a metal-insulator-metal (MIM) technology, a micro-electromechanical systems (MEMS) technology, etc.

Turning now to the control circuitry 104, such circuitry 104 may include any discrete or integrated hardware that controls a capacitance that is exhibited by the capacitive element(s) 110 by feeding appropriate values (corresponding to appropriate capacitances) to the decoder 108 which, in turn, feeds corresponding capacitance settings to the capacitive element(s) 110. In one possible embodiment, the circuitry 104 may accomplish this utilizing the counter 106. In the context of the present description, the aforementioned counter 106 refers to any device or component that is capable of creating an additional one or more values between the aforementioned first (e.g. previous) value and second (e.g. desired) value, in order to create one or more additional values therebetween for use in transitioning between the corresponding capacitances. In one optional embodiment, the counter 106 may serve to periodically increment between sequential integers (e.g. 0, 1, 2, 3 . . . N, etc.), in accordance with a fixed timing schedule. In different embodiments, the counter 106 may optionally be implemented by incorporating a clock, an incrementing device, a decrementing device, etc.

In use, the control circuitry 104 is configured to control a transition of the capacitance of the capacitive element(s) 110 from the first capacitance to the second capacitance. By this design, instead of simply transitioning directly from the first value (and the corresponding previous capacitance) down/up to the second value (and the corresponding desired capacitance), the control circuitry 104 is configured to control the capacitive element(s) 110 to ensure that the at least one additional transition is incorporated between the first value (and the corresponding previous capacitance) and the second value (and the corresponding desired capacitance). For example, the capacitive element(s) 110 may be transitioned from the previous capacitance to an intermediate capacitance at a first time, and then transitioned from intermediate capacitance to the desired capacitance at a second time.

In other embodiments, more than one intermediate capacitance may be utilized in connection with multiple transitions between the previous capacitance and the desired capacitance. Further, as will become apparent during the description of different subsequently-described embodiments, the number of transitions between the previous and desired capacitances may be fixed, thus allowing for a configurable capacitance step size. In other embodiments, a capacitance step size associated with any transition may be fixed, thus allowing for a configurable number of transitions between the previous and desired capacitances.

In any case, one or more of the foregoing features may permit a more gradual or granular transition between previous and desired capacitances. This may, in turn, result in fewer detrimental side effects that would otherwise be foregone in systems that simply transition directly from the previous capacitance to the desired capacitance, in a single step. For example, in the case of a voltage controlled oscillator (VCO), any sudden change in capacitance may be avoided which, in turn, may help avoid any overshoot and spur (in voltage) in a frequency domain. Further, in the case of closed loop impedance tuning, a large change of a tuning capacitor may be avoided which, in turn, may help avoid any amplitude and phase discontinuity in a signal, for providing improved decoding of a downlink and/or uplink signal. It should be noted that the aforementioned potential advantages are set forth for illustrative purposes only and should not be construed as limiting in any manner. In particular, the apparatus 100 may be employed in any desired application/environment and may therefore exhibit other advantages relevant to such other applications.

More illustrative information will now be set forth regarding various optional architectures and uses in which the foregoing method may or may not be implemented, per the desires of the user. For example, various embodiments will be described that employ different techniques for using a counter (e.g. the aforementioned counter 106, etc.) to control a transition between capacitances. It should be noted that the following information is set forth for illustrative purposes and should not be construed as limiting in any manner. Any of the following features may be optionally incorporated with or without the other features described.

Figure 2:
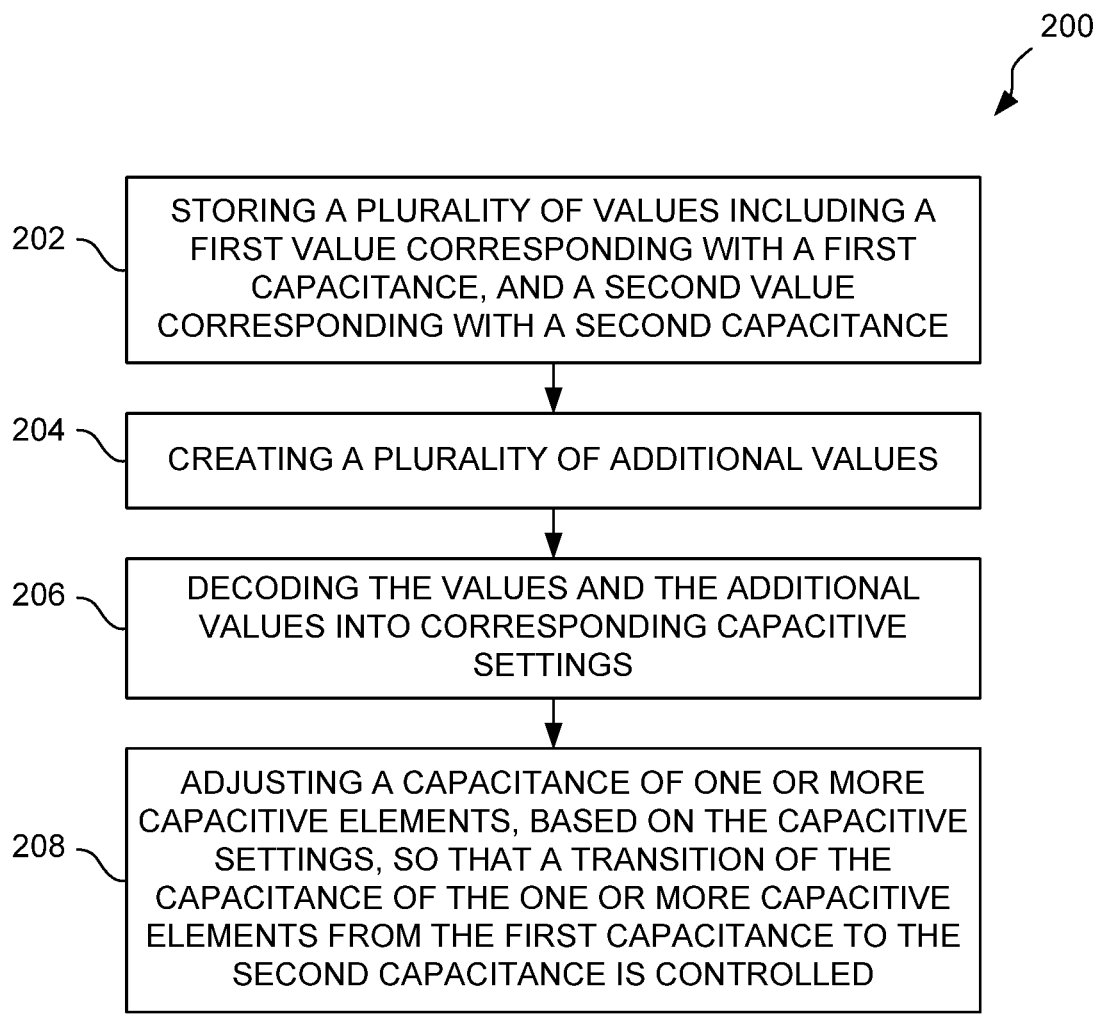
FIG. 2 illustrates a method for controlling a transition of a capacitance of one or more capacitive elements from a first capacitance to a second capacitance, in accordance with an embodiment.

FIG. 2 illustrates a method 200 for controlling a transition of a capacitance of one or more capacitive elements from a first capacitance to a second capacitance, in accordance with an embodiment. As an option, the method 200 may be implemented in the context of any one or more of the embodiments set forth in any previous and/or subsequent figure(s) and/or the description thereof. For example, the method 200 may be carried out in the context of the apparatus 100 of FIG. 1. However, it is to be appreciated that the method 200 may be implemented in other suitable environments.

As shown, in operation 202, a plurality of values are stored, utilizing one or more registers (e.g. the register(s) 102 of FIG. 1). As will be elaborated upon later, such values may be input into the register(s) by application circuitry/software or a user via an interface. In any case, at any given time, the register(s) may store a first value corresponding with a first capacitance (e.g. a previous capacitance), and a second value corresponding with a second capacitance (e.g. a desired capacitance).

With continuing reference to FIG. 2, a plurality of additional values are created in operation 204, utilizing control circuitry including a counter 106 (e.g. the control circuitry 104/counter 106 of FIG. 1). As will soon become apparent, such additional values may be used to create additional steps/transitions in capacitance values ultimately exhibited by one or more capacitive elements (e.g. the capacitive element(s) 110 of FIG. 1). To this end, the aforementioned counter may be configured to control the transition of the capacitance of the capacitive element(s), by creating a plurality of additional values between the first value and the second value for being decoded by the decoder.

Further, such additional values may be created in any desired manner. For example, in one embodiment, a number of the additional values may be fixed. It should be noted that, in such embodiment, the number of transitions between the first value (corresponding with the previous capacitance) and the second value (corresponding with the desired capacitance), is also fixed [e.g. the number of additional values plus (+) one (1)]. In such embodiment, the counter may optionally be configured to count only to a fixed number. Still yet, a difference (e.g. step size) between each of the additional values (and, thus, a magnitude of each of the additional values) may be determined by dividing a difference between the first value (corresponding with the previous capacitance) and the second value (corresponding with the desired capacitance), by the aforementioned fixed number.

For example, if the first value is one (1) and the second value is seven (7), and the fixed number (of additional values) is two (2), the step size is three (3). Further, to the extent that the foregoing division does not render an integer, the difference between the additional values may be further calculated by rounding a result of the foregoing division down to a nearest integer. For example, if the first value is one (1) and the second value is eight (8), and the fixed number (of additional values) is two (2), the step size is still two (2).

In another embodiment, a difference between the additional values (e.g. step size) may be fixed. In such embodiment, the counter may optionally be configured to calculate a number of the additional values by dividing a difference between the first value and the second value, by the fixed difference. For example, in one possible embodiment where the first value is one (1) and the second value is seven (7), and the difference (e.g. step size) is two (2), the step size is three (3).

In still other embodiments, the control circuitry may be configured to calculate the additional values based on a maximum length of time permitted for the transition of the capacitance of the one or more capacitive elements, and a maximum difference permitted between the additional values (e.g. step size). In such embodiment, the maximum length of time permitted for the transition may be governed by the particular application. Specifically, due to timing constraints of the application or environment thereof, such maximum time may be limited. For instance, a real-time system application may require a lower maximum transition time, as compared to other applications.

Further, the circuitry associated with the application (e.g. VCO, impedance matching circuit, etc.) may govern the maximum step size. For instance, a VCO may permit a first (larger) maximum step size before exhibiting any overshoot and spur (in voltage) in a frequency domain, while an impedance matching circuitry may permit a second (smaller) maximum step size before exhibiting any amplitude (gain) and phase discontinuity.

In any case, the maximum transition time and maximum step size govern a number of steps (e.g. additional values) that are to be used via the counter to implement a specific transition sequence (in terms of size and number). For example, in one possible embodiment where the maximum transition time is ten (10) time-related units, the maximum step size is five (5) size-related units, and a difference between the first value (corresponding with the previous capacitance) and the second value (corresponding with the desired capacitance) is thirty (30) size-related units; one possible transition sequence may including a step size of three (3) occurring at each one (1) time unit during the maximum transition time (i.e. 3*10=30).

With continuing reference to FIG. 2, regardless of the manner in which the additional values are created, the values (stored in operation 202) and the additional values (created in operation 204) are decoded, utilizing a decoder (e.g. the decoder 108 of FIG. 1). See operation 206. Specifically, such values and additional values are decoded into corresponding capacitive settings. To this end, a capacitance of one or more capacitive elements (e.g. the capacitive element(s) 110 of FIG. 1) may be adjusted in operation 208, based on the capacitive settings. To this end, control is established over a transition of the capacitance of the capacitive element(s) from the first capacitance to the second capacitance, so that such transition is implemented in a more gradual and/or granular manner.

Figure 3:
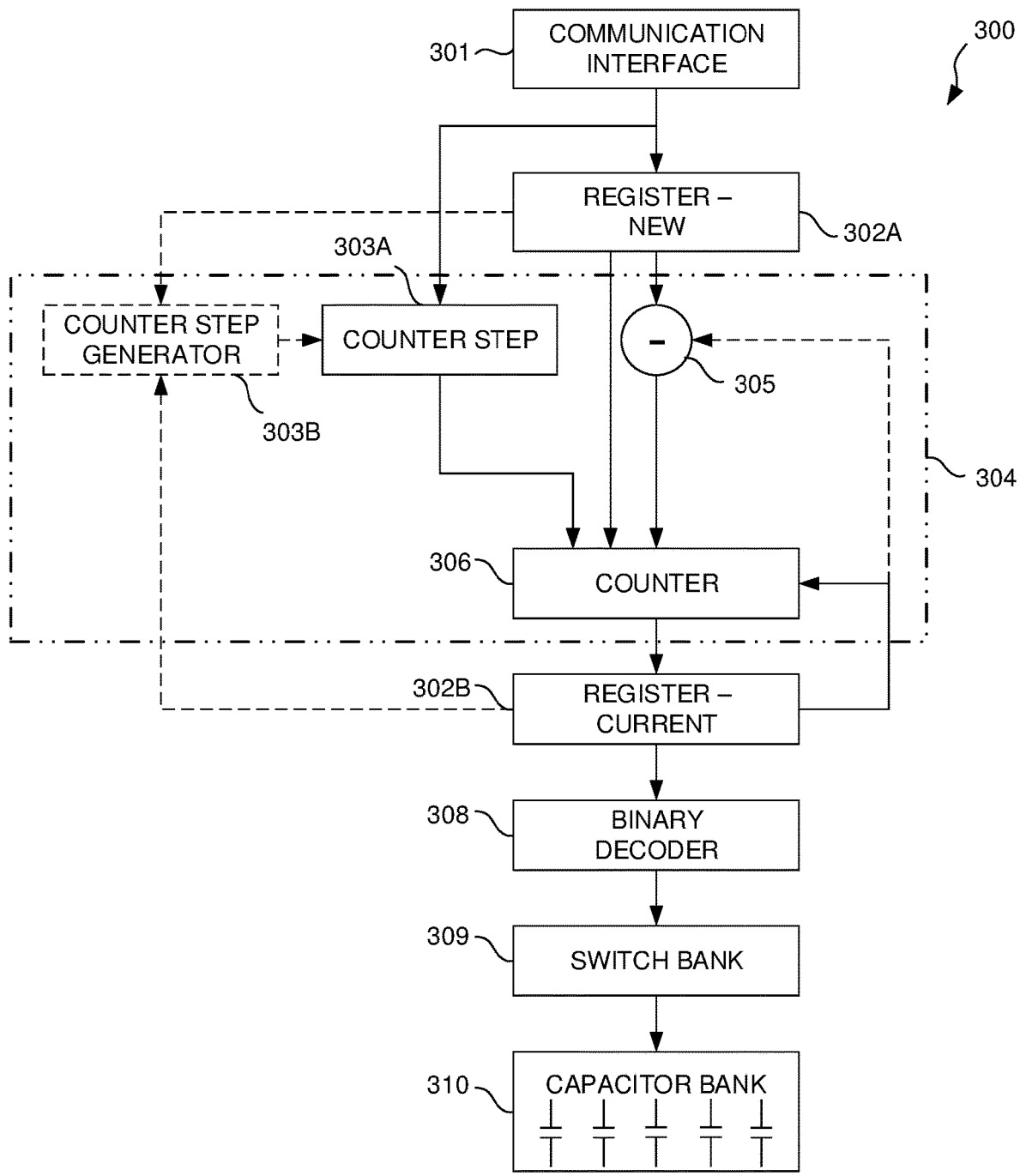
FIG. 3 illustrates an apparatus for controlling a transition of a capacitance of one or more capacitive elements from a first capacitance to a second capacitance, in accordance with another embodiment.

FIG. 3 illustrates an apparatus 300 for controlling a transition of a capacitance of one or more capacitive elements from a first capacitance to a second capacitance, in accordance with another embodiment. As an option, the apparatus 300 may be implemented in the context of any one or more of the embodiments set forth in any previous and/or subsequent figure(s) and/or the description thereof. For example, the apparatus 300 may incorporate one or more of the features of the apparatus 100 of FIG. 1 and/or may be used to carry out the method 200 of FIG. 2. However, it is to be appreciated that the apparatus 300 may be implemented in other suitable environments.

As shown, the apparatus 300 includes a communication interface 301 in electrical communication with a first register 302A and a second register 302B, where control circuitry 304 is in electrical communication between the registers 302A, 302B. The control circuitry 304 includes a comparator 305, a counter 306, a counter step register 303A, and an optional counter step generator 303B coupled, as shown. The second register 302B is, in turn, in electrical communication with a decoder 308 that is in electrical communication with one or more capacitive elements 310 via a switch bank 309. More information will now be set forth regarding each of the foregoing components and an interoperation thereof.

The communication interface 301 may include any interface for feeding a value corresponding to a desired (i.e. new) capacitance to the first register 302A for storage therein. In various embodiments, the communication interface 301 serves to receive the aforementioned value from one or more hosts for controlling the apparatus 300. In addition to receiving the aforementioned value, other configuration information may be received such as power saving settings, instructions to combine multiple capacitor banks into one, etc. To accomplish this, the communication interface 301 may include, but is not limited to a radio frequency (RF) front-end control interface (RFFE), inter-integrated circuit I²C interface, a southbound interface (SBI), or any other type of interface, for that matter.

In use, the first register 302A and the second register 302B are registered for storing a programmed capacitance and an intermittent capacitance, respectively. In various embodiments, the mapping of a register value setting in the registers 302A, 302B to an ultimate capacitance value may be linear or nonlinear. In one possible embodiment, the capacitance value is proportional to the register value. In another embodiment, the aforementioned capacitance value may be a linear function of the register value.

As mentioned earlier, the first register 302A is programmed through the communication interface 301. An initial value of the second register 302B may be programmed through communication during the initialization process, or by using a hardwired default value. Thereafter, the value of the second register 302B may be determined by the value of the first register 302A and the control circuit 304.

The counter step register 303A stores a counter step. In one embodiment, the counter step may be fixed and programmed through the communication interface 301. In another optional embodiment, the counter step may be generated by an optional counter step generator 303B using a subtracting/dividing arithmetic unit therein based on initial and target capacitance values (via the registers 302A, 302B).

In use, the comparator 305 compares the initial capacitance value and new capacitance setting (via the registers 302A, 302B), and determines the counter's counting direction (i.e. counting up and counting down). For example, if an initial value is less than a new value, the counting direction will involve counting up. On the other hand, if an initial value is greater than a new value, the counting direction will involve counting down.

Further, the counter 306 may include any circuit which increases or decreases the counter step periodically in the counting direction dictated by the comparator 305. The counter 306 may thus, in various embodiments, be driven by a clock circuit (not shown). Once the first register 302A is updated through the communication interface 301, the value in the second register 302B may be loaded into the counter 306 (via the signal path shown in FIG. 3), and the counter 306 may count up or count down by the counter step (stored in the counter step register 303A) every clock cycle. The value of the counter 306 is directly mapped into the second register 302B. More information regarding possible operation of the foregoing components will be elaborated upon during the description of different embodiments shown in FIGS. 4-5.

To this end, each of the values may be fed in accordance with a predetermined sequence (driven by the counter 306) to the decoder 308 which, in turn, feeds corresponding capacitance settings to the switch bank 309 that, in turn, controls a capacitance exhibited by the capacitive element(s) 310. In one embodiment, the switch bank 309 may include a plurality of switches that dictate which of the capacitive element(s) 310 are currently part of an active circuit, for controlling a capacitance thereof. In another embodiment, the switch bank 309 may include a plurality of switches that dictate in which state the capacitive element(s) 310 is currently operating, for controlling a capacitance thereof. In use, the capacitive element(s) 310 may have two distinct states, each with its own capacitance value. Further, this process may be iterated for each desired capacitance-related value received from the communication interface 301.

By this design, the control circuitry 304 is configured to control a transition of the capacitance of the capacitive element(s) 310 from the previous to the desired capacitance via time-spaced, stepped intermediate capacitances, regardless of the linear or nonlinear mapping between the registers 302A, 302B and corresponding capacitance. By this design, instead of simply transitioning directly from the previous to the desired capacitance, the control circuitry 304 is configured to control the capacitive element(s) 310 to ensure a more gradual and/or granular transition, thereby potentially avoiding detrimental side effects that would otherwise accompany a more direct, sudden change in capacitance.

Figure 4:
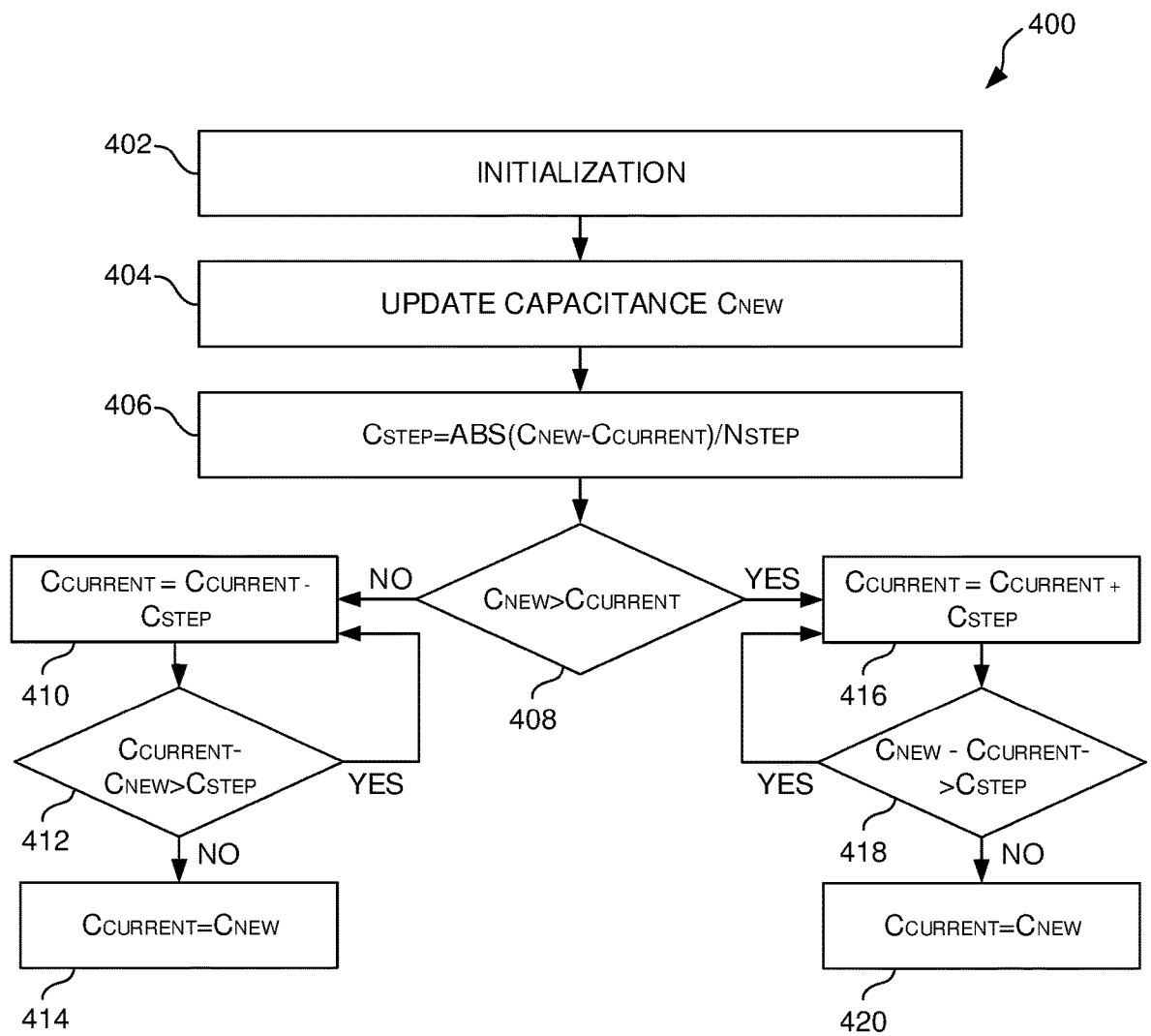
FIG. 4 illustrates a method for controlling a transition of a capacitance of one or more capacitive elements from a first capacitance to a second capacitance, in accordance with another embodiment involving a fixed number of transitional steps.
Figure 5:
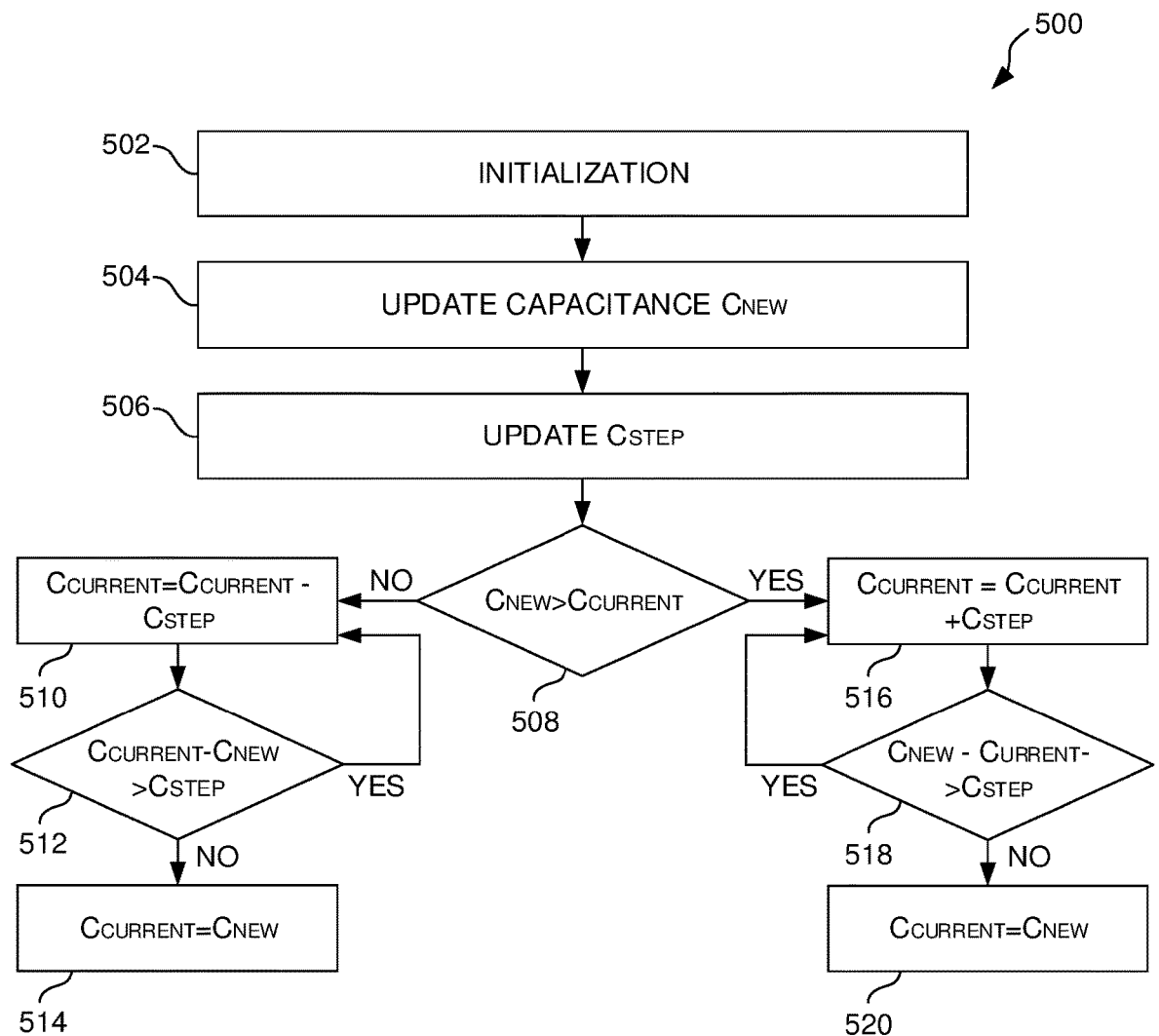
FIG. 5 illustrates a method for controlling a transition of a capacitance of one or more capacitive elements from a first capacitance to a second capacitance, in accordance with another embodiment involving a fixed transitional capacitive step size.

More information will now be set forth regarding different ways the control circuitry 304 may afford the foregoing gradual and/or granular transition in accordance with a first embodiment involving a fixed number of transitional steps (in FIG. 4) and a second embodiment involving a fixed transitional capacitive step size (in FIG. 5). In any case, the control circuitry 304 may include any additional (unillustrated) circuitry such as digital logic (which may, in some embodiments, be controlled by software), in order to carry out the mathematics described below.

FIG. 4 illustrates a method 400 for controlling a transition of a capacitance of one or more capacitive elements from a first capacitance to a second capacitance, in accordance with another embodiment involving a fixed number of transitional steps. As an option, the method 400 may be implemented in the context of any one or more of the embodiments set forth in any previous and/or subsequent figure(s) and/or the description thereof. For example, the method 400 may be carried out in the context of the apparatus 100 and/or 300 of FIGS. 1 and 3, respectively. However, it is to be appreciated that the method 400 may be implemented in other suitable environments. To simplify the illustration, a linear mapping between register value and capacitance value will be used.

As shown, initialization occurs in operation 402 whereby various configuration information may be received to dictate operation of an apparatus (e.g. the apparatus 100 and/or 300 of FIGS. 1 and 3, respectively). As mentioned earlier, such configuration information may include power saving settings, instructions to combine multiple capacitor banks into one, etc. Further, such configuration information may be received via a communication interface (e.g. the communication interface 301 of FIG. 3).

As indicated in operation 404, during use, a desired new capacitance-related value (Cnew) is updated in a relevant register (e.g. the first register 302A of FIG. 3). Further, any previous, initial, default, or intermediate capacitance-related value ($C_{current}$) may also be stored in a corresponding register (e.g. the second register 302B of FIG. 3). In the present method 400, a number of transitional steps ($N_{step}$) is fixed, thus a transitional capacitive step size ($C_{step}$) is calculated per Equation #1.

$$C_{step} = ABS(C_{new} - C_{current})/N_{step} \qquad \text{Equation \#1}$$

The method 400 then determines, in decision 408, whether $C_{new}$ is greater than $C_{current}$. If so, any subsequent transitional steps will be incremental. If not, any subsequent transitional steps will be decremented.

If decremented per decision 408, a current transitional value is calculated by subtracting $C_{step}$ in operation 410. It should be noted that, if operation 410 is carried out in the context of an initial transitional step, $C_{step}$ is subtracted from $C_{current}$ which takes the form of a previous, default, or initial value, in order to create an intermediate $C_{current}$.

Further, in decision 412, it is determined whether a difference between $C_{current}$ and $C_{new}$ is greater than $C_{step}$. If so, there is an opportunity for an additional transitional step and the method 400 iterates operation 410. If not, however, $C_{current}$ is simply set to $C_{new}$ in operation 414, and the transition from $C_{current}$ to $C_{new}$ is complete.

Returning to decision 408 as to whether $C_{new}$ is greater than $C_{current}$ and the case where any subsequent transitional steps will be incremental, a current transitional value is calculated by adding $C_{step}$ in operation 416. Again, it should be noted that, if operation 410 is carried out in the context of an initial transitional step, $C_{step}$ is added to $C_{current}$ which takes the form of a previous, default, or initial value, in order to create an intermediate $C_{current}$.

Further, in decision 418, it is determined whether a difference between $C_{current}$ and $C_{new}$ is greater than $C_{step}$. If so, there is an opportunity for an additional transitional step and the method 400 iterates operation 416. If not, however, $C_{current}$ is simply set to $C_{new}$ in operation 420, and the transition from $C_{current}$ to $C_{new}$ is complete.

FIG. 5 illustrates a method 500 for controlling a transition of a capacitance of one or more capacitive elements from a first capacitance to a second capacitance, in accordance with another embodiment involving a fixed transitional capacitive step size. As an option, the method 500 may be implemented in the context of any one or more of the embodiments set forth in any previous and/or subsequent figure(s) and/or the description thereof. For example, the method 500 may be carried out in the context of the apparatuses 100 and/or 300 of FIGS. 1 and 3, respectively. However, it is to be appreciated that the method 500 may be implemented in other suitable environments.

As shown, operations 502, 504, 508, 510, 512, 514, 516, 518, and 520 of the method 500 are similar to the corresponding operations 402, 404, 408, 410, 412, 414, 416, 418, and 420 of the method 400, respectively. With respect to operation 506, however, the method 500 differs from the method 400 insofar as $C_{step}$ is fixed. To this end, instead of calculating $C_{step}$ per Equation #1, the method 500 simply transitions, at each step, at increments/decrements equal to $C_{step}$, and $N_{step}$ is calculated by Equation #2.

$$N_{step} = ABS(C_{new} - C_{current})/C_{step} \qquad \text{Equation \#2}$$

In any case, a transition from a previous capacitance to a current capacitance is more gradual and/or granular in order to avoid any possible side effects that would otherwise occur as a result of a more direct, sudden change in capacitance.

Figure 6:
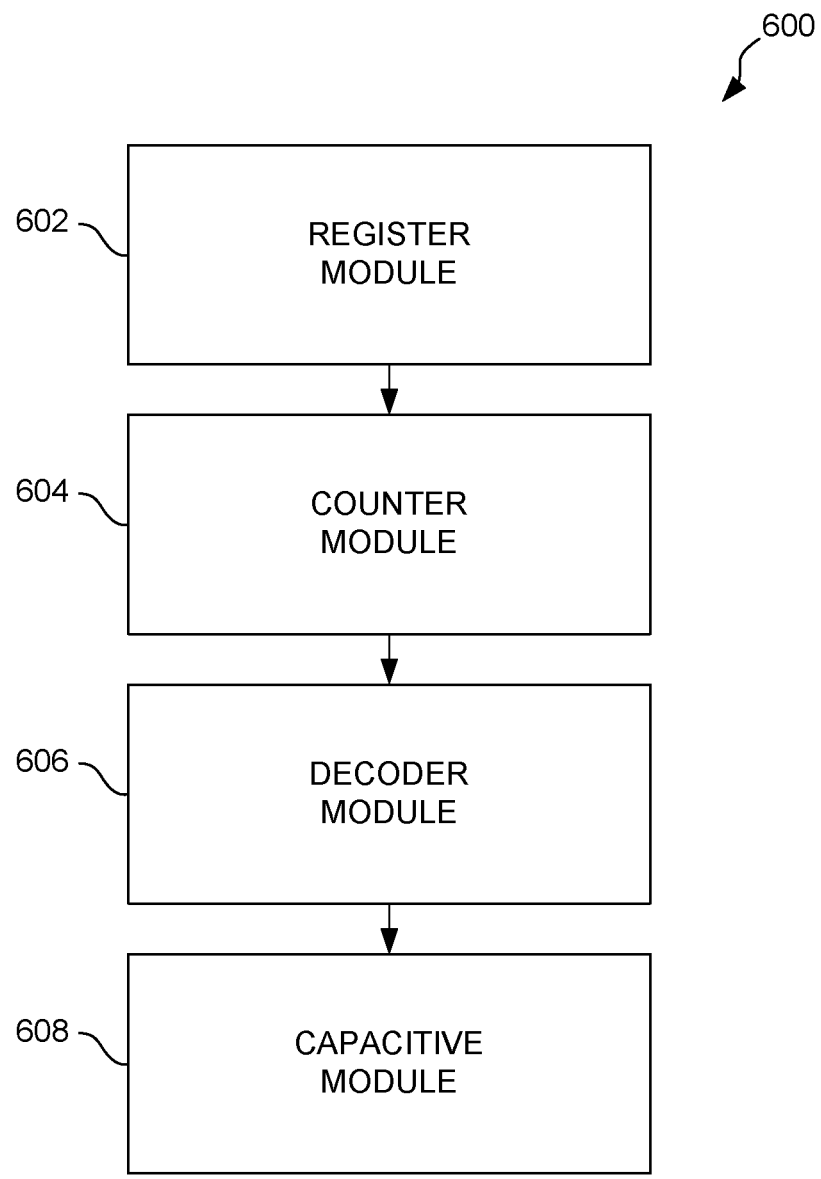
FIG. 6 illustrates a system for controlling a transition of a capacitance of one or more capacitive elements from a first capacitance to a second capacitance, in accordance with an embodiment.

FIG. 6 illustrates a system 600 for controlling a transition of a capacitance of one or more capacitive elements from a first capacitance to a second capacitance, in accordance with an embodiment. As an option, the system 600 may be implemented with one or more features of any one or more of the embodiments set forth in any previous and/or subsequent figure(s) and/or the description thereof. However, it is to be appreciated that the system 600 may be implemented in other suitable environments.

As shown, a register means in the form of a register module 602 is provided for storing a plurality of values including a first value corresponding with a first capacitance, and a second value corresponding with a second capacitance (e.g. operation 202 of FIG. 2). In various embodiments, the register module 602 may include, but is not limited to the register(s) 102 of FIG. 1, registers 302A, 302B of FIG. 3, memory (to be described later), and/or any other circuitry capable of the aforementioned functionality.

Also included is a counter means in the form of a counter module 604 in communication with the register module 602 for creating a plurality of additional values (e.g. operation 204 of FIG. 2). In various embodiments, the counter module 604 may include, but is not limited to the counter 106 of FIG. 1, counter 306 of FIG. 3, at least one processor (to be described later) and any software controlling the same, and/or any other circuitry capable of the aforementioned functionality.

With continuing reference to FIG. 6, decoder means in the form of a decoder module 606 is in communication with the counter module 604 for decoding the values and the additional values into corresponding capacitive settings (e.g. operation 206 of FIG. 2). In various embodiments, the decoder module 606 may include, but is not limited to the decoder 108 of FIG. 1, decoder 308 of FIG. 3, at least one processor (to be described later) and any software controlling the same, and/or any other circuitry capable of the aforementioned functionality.

Still yet, capacitive means in the form of a capacitive module 608 is in communication with the decoder module 606 for adjusting a capacitance of one or more capacitive elements, based on the capacitive settings, so that a transition of the capacitance of the one or more capacitive elements is controlled from the first capacitance to the second capacitance (e.g. operation 208 of FIG. 2). In various embodiments, the capacitive module 608 may include, but is not limited to the capacitive element(s) 110 of FIG. 1, capacitive element(s) 310 of FIG. 3, and/or any other circuitry capable of the aforementioned functionality.

Figure 7:
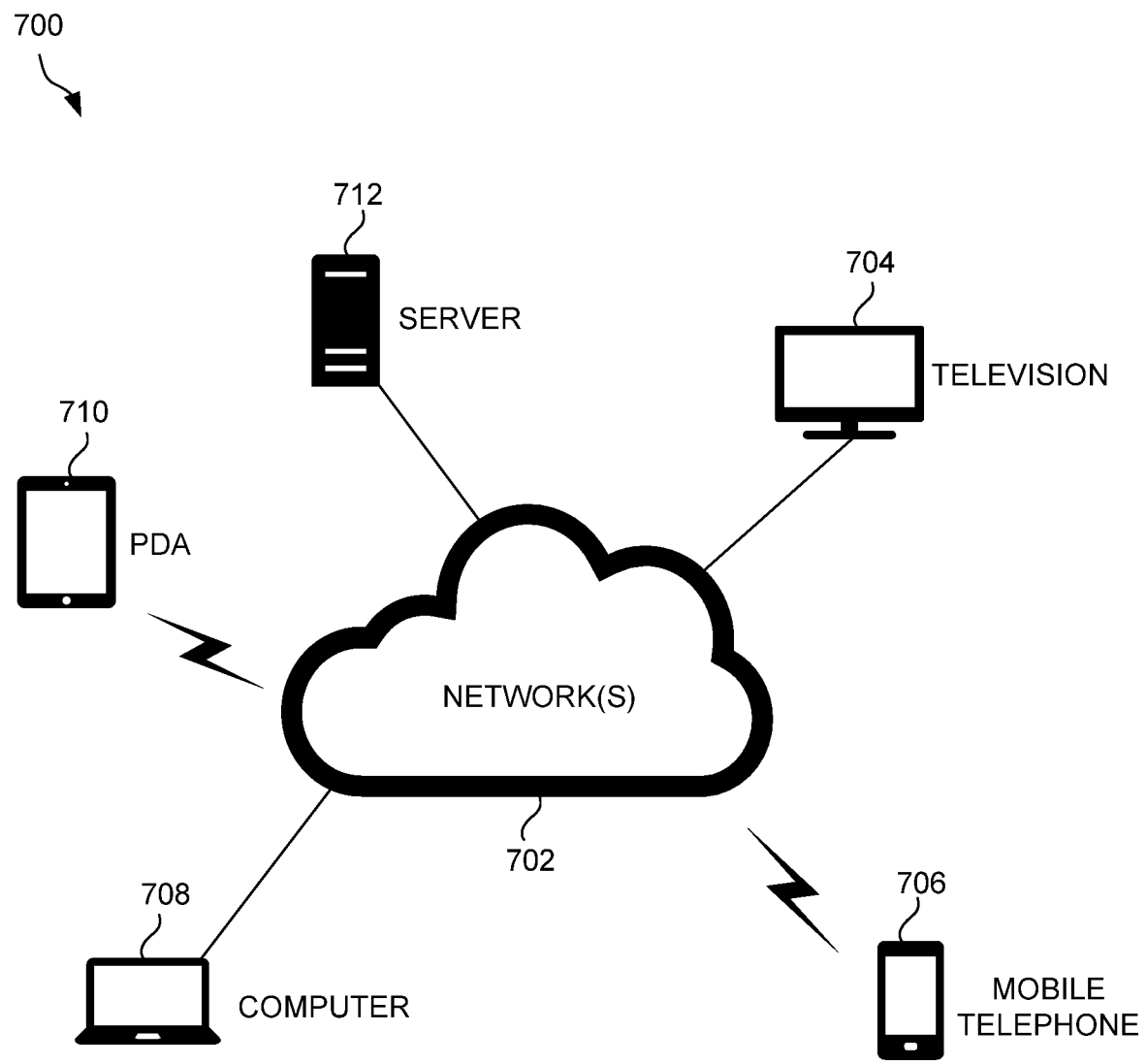
FIG. 7 is a diagram of a network architecture, in accordance with an embodiment.

FIG. 7 is a diagram of a network architecture 700, in accordance with an embodiment. As shown, at least one network 702 is provided. In various embodiments, any one or more components/features set forth during the description of any previous figure(s) may be implemented in connection with any one or more of the components of the at least one network 702.

In the context of the present network architecture 700, the network 702 may take any form including, but not limited to a telecommunications network, a local area network (LAN), a wireless network, a wide area network (WAN) such as the Internet, peer-to-peer network, cable network, etc. While only one network is shown, it should be understood that two or more similar or different networks 702 may be provided.

Coupled to the network 702 is a plurality of devices. For example, a server 712 and a computer 708 may be coupled to the network 702 for communication purposes. Such computer 708 may include a desktop computer, lap-top computer, and/or any other type of logic. Still yet, various other devices may be coupled to the network 702 including a personal digital assistant (PDA) device 710, a mobile phone device 706, a television 704, etc.

Figure 8:
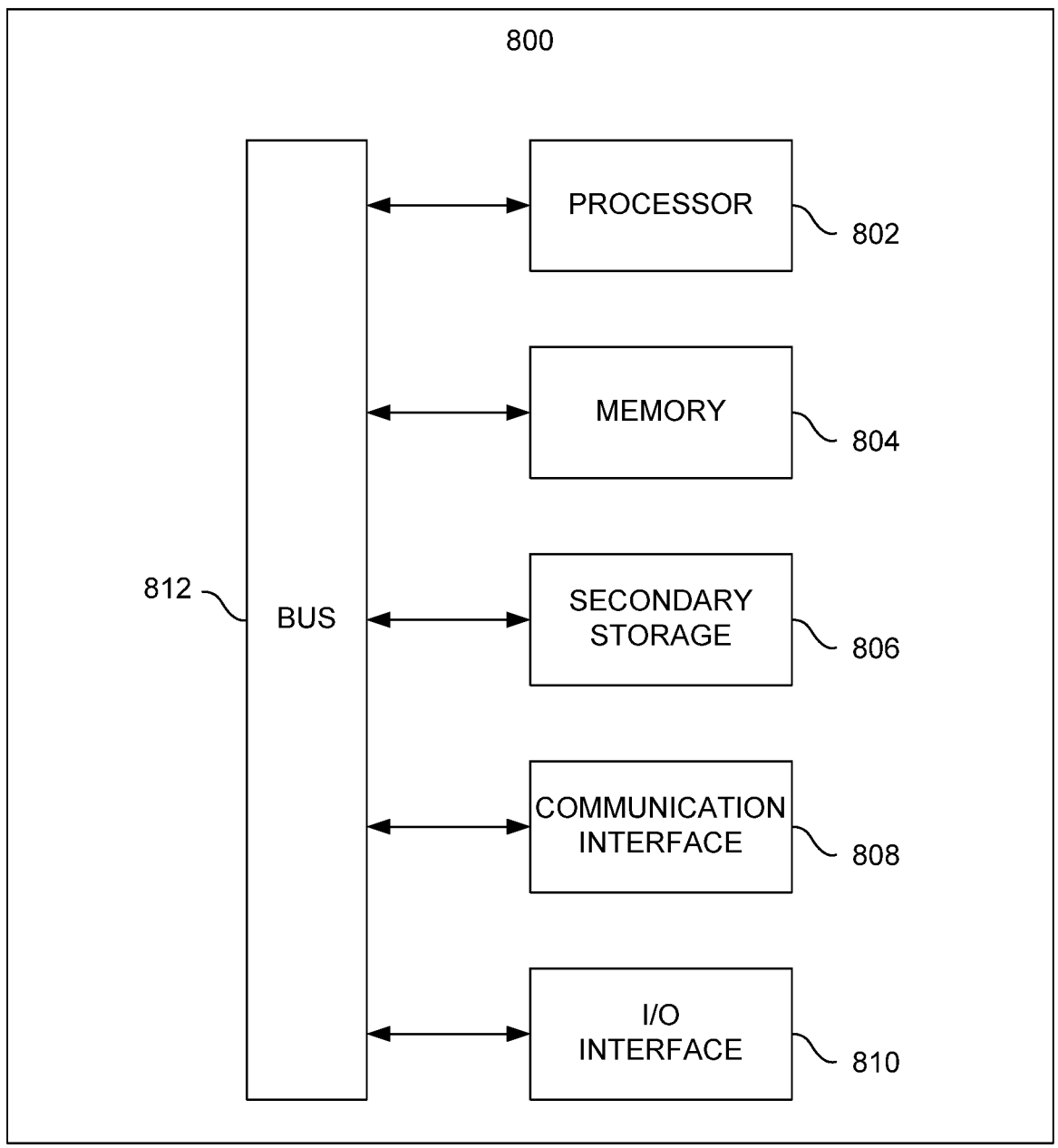
FIG. 8 is a diagram of an exemplary processing device, in accordance with an embodiment.

FIG. 8 is a diagram of an exemplary processing device 800, in accordance with an embodiment. As an option, the processing device 800 may be implemented in the context of any of the devices of the network architecture 700 of FIG. 7. However, it is to be appreciated that the processing device 800 may be implemented in any desired environment.

As shown, the processing device 800 includes at least one processor 802 which is connected to a bus 812. The processing device 800 also includes memory 804 [e.g., hard disk drive, solid state drive, random access memory (RAM), etc.] coupled to the bus 812. The memory 804 may include one or more memory components, and may even include different types of memory.

Further included is a communication interface 808 (e.g. local/remote network interface, memory access interface, etc.) and an input/output (I/O) interface 810 (e.g. display, speaker, microphone, touchscreen, touchpad, mouse interface, etc.).

The processing device 800 may also include a secondary storage 806. The secondary storage 806 coupled to the bus 812 and/or to other components of the processing device 800. The secondary storage 806 can include, for example, a hard disk drive and/or a removable storage drive, representing a floppy disk drive, a magnetic tape drive, a compact disk drive, etc. The removable storage drive reads from and/or writes to a removable storage unit in a well-known manner.

Computer programs, or computer control logic algorithms, may be stored in the memory 804, the secondary storage 806, and/or any other memory, for that matter. Such computer programs, when executed, enable the processing device 800 to perform various functions (as set forth above, for example). Memory 804, secondary storage 806 and/or any other storage comprise non-transitory computer-readable media.

It is noted that the techniques described herein, in an aspect, are embodied in executable instructions stored in a computer readable medium for use by or in connection with an instruction execution machine, apparatus, or device, such as a computer-based or processor-containing machine, apparatus, or device. It will be appreciated by those skilled in the art that for some embodiments, other types of computer readable media are included which may store data that is accessible by a computer, such as magnetic cassettes, flash memory cards, digital video disks, Bernoulli cartridges, random access memory (RAM), read-only memory (ROM), or the like.

As used here, a "computer-readable medium" includes one or more of any suitable media for storing the executable instructions of a computer program such that the instruction execution machine, system, apparatus, or device may read (or fetch) the instructions from the computer readable medium and execute the instructions for carrying out the described methods. Suitable storage formats include one or more of an electronic, magnetic, optical, and electromagnetic format. A non-exhaustive list of conventional exemplary computer readable medium includes: a portable computer diskette; a RAM; a ROM; an erasable programmable read only memory (EPROM or flash memory); optical storage devices, including a portable compact disc (CD), a portable digital video disc (DVD), a high definition DVD (HD-DVD™), a BLU-RAY disc; or the like.

Computer-readable non-transitory media includes all types of computer readable media, including magnetic storage media, optical storage media, and solid state storage media and specifically excludes signals. It should be understood that the software can be installed in and sold with the devices described herein. Alternatively the software can be obtained and loaded into the devices, including obtaining the software via a disc medium or from any manner of network or distribution system, including, for example, from a server owned by the software creator or from a server not owned but used by the software creator. The software can be stored on a server for distribution over the Internet, for example.

It should be understood that the arrangement of components illustrated in the Figures described are exemplary and that other arrangements are possible. It should also be understood that the various system components defined by the claims, described below, and illustrated in the various block diagrams represent logical components in some systems configured according to the subject matter disclosed herein.

For example, one or more of these system components may be realized, in whole or in part, by at least some of the components illustrated in the arrangements illustrated in the described Figures. In addition, while at least one of these components are implemented at least partially as an electronic hardware component, and therefore constitutes a machine, the other components may be implemented in software that when included in an execution environment constitutes a machine, hardware, or a combination of software and hardware.

More particularly, at least one component defined by the claims is implemented at least partially as an electronic hardware component, such as an instruction execution machine (e.g., a processor-based or processor-containing machine) and/or as specialized circuits or circuitry (e.g., discrete logic gates interconnected to perform a specialized function). Other components may be implemented in software, hardware, or a combination of software and hardware. Moreover, some or all of these other components may be combined, some may be omitted altogether, and additional components may be added while still achieving the functionality described herein. Thus, the subject matter described herein may be embodied in many different variations, and all such variations are contemplated to be within the scope of what is claimed.

In the description above, the subject matter is described with reference to acts and symbolic representations of operations that are performed by one or more devices, unless indicated otherwise. As such, it will be understood that such acts and operations, which are at times referred to as being computer-executed, include the manipulation by the processor of data in a structured form. This manipulation transforms the data or maintains it at locations in the memory system of the computer, which reconfigures or otherwise alters the operation of the device in a manner well understood by those skilled in the art. The data is maintained at physical locations of the memory as data structures that have particular properties defined by the format of the data. However, while the subject matter is being described in the foregoing context, it is not meant to be limiting as those of skill in the art will appreciate that various of the acts and operations described hereinafter may also be implemented in hardware.

To facilitate an understanding of the subject matter described herein, many aspects are described in terms of sequences of actions. At least one of these aspects defined by the claims is performed by an electronic hardware component. For example, it will be recognized that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

The embodiments described herein include the one or more modes known to the inventor for carrying out the claimed subject matter. It is to be appreciated that variations of those embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. An apparatus, comprising:
   one or more registers configured to store a plurality of values including a first value corresponding with a first capacitance, and a second value corresponding with a second capacitance;
   a decoder configured to decode the values into corresponding capacitive settings;
   one or more capacitive elements in electrical communication with the decoder, the one or more capacitive elements configured to exhibit different capacitances, based on the capacitive settings; and
   control circuitry in electrical communication with the decoder and the one or more registers, the control circuitry configured to control a transition of a capacitance of the one or more capacitive elements from the first capacitance to the second capacitance, by creating a plurality of additional values between the first value and the second value for being decoded by the decoder based on a fixed value, wherein the fixed value is a fixed quantity of the plurality of additional values or a fixed difference between any two adjacent additional values among the plurality of additional values.

2. The apparatus of claim 1, wherein the control circuitry includes a counter for creating the additional values between the first value and the second value.

3. The apparatus of claim 1, wherein the fixed value is the fixed quantity of the plurality of additional values.

4. The apparatus of claim 3, wherein the control circuitry is configured to calculate a difference between the additional values by dividing a difference between the first value and the second value, by the fixed quantity.

5. The apparatus of claim 4, wherein the control circuitry is configured to calculate the difference between the additional values by rounding a result of the dividing down to a nearest integer.

6. The apparatus of claim 1, wherein the fixed value is the fixed difference between any two adjacent additional values among the plurality of additional values.

7. The apparatus of claim 6, wherein the control circuitry is configured to calculate a number of the additional values by dividing a difference between the first value and the second value, by the fixed difference.

8. The apparatus of claim 1, wherein the control circuitry is configured to calculate the additional values based on a maximum length of time permitted for the transition of the capacitance of the one or more capacitive elements, and a maximum difference permitted between the additional values.

9. The apparatus of claim 1, wherein the one or more capacitive elements include a plurality of fixed capacitive elements, and the apparatus further comprises one or more switches for selectively using the fixed capacitive elements.

10. The apparatus of claim 1, wherein the one or more capacitive elements include one or more variable capacitive elements, and the apparatus further comprises one or more controllers for controlling the capacitance of the one or more variable capacitive elements.

11. A method, comprising:
   storing, utilizing one or more registers, a plurality of values including a first value corresponding with a first capacitance, and a second value corresponding with a second capacitance;
   creating a plurality of additional values between the first value and the second value based on a fixed value, wherein the fixed value is a fixed quantity of the plurality of additional values or a fixed difference between any two adjacent additional values among the plurality of additional values;

decoding, utilizing a decoder, the values and the additional values into corresponding capacitive settings; and adjusting a capacitance of one or more capacitive elements, based on the capacitive settings, so that a transition of the capacitance of the one or more capacitive elements is controlled from the first capacitance to the second capacitance.

12. The method of claim 11, wherein the additional values are created utilizing a counter.

13. The method of claim 11, wherein the fixed value is the fixed quantity of the plurality of additional values.

14. The method of claim 13, and further comprising:
calculating a difference between the additional values by dividing a difference between the first value and the second value, by the fixed quantity.

15. The method of claim 14, wherein the difference between the additional values is calculated by rounding a result of the dividing down to a nearest integer.

16. The method of claim 11, wherein the fixed value is the fixed difference between any two adjacent additional values among the plurality of additional values.

17. The method of claim 16, and further comprising:
calculating a number of the additional values by dividing a difference between the first value and the second value, by the fixed difference.

18. The method of claim 11, wherein the additional values are created based on a maximum length of time permitted for the transition of the capacitance of the one or more capacitive elements, and a maximum difference permitted between the additional values.

19. The method of claim 11, wherein the one or more capacitive elements include a plurality of fixed capacitive elements with one or more switches for selectively using the fixed capacitive elements.

20. The method of claim 11, wherein the one or more capacitive elements include one or more variable capacitive elements, with one or more controllers for controlling the capacitance of the one or more variable capacitive elements.

* * * * *